(12) United States Patent
Koyama et al.

(10) Patent No.: US 6,917,142 B2
(45) Date of Patent: Jul. 12, 2005

(54) PIEZOELECTRIC OSCILLATOR, PORTABLE TELEPHONE USING A PIEZOELECTRIC OSCILLATOR, AND ELECTRONIC DEVICE USING A PIEZOELECTRIC OSCILLATOR

(75) Inventors: Yugo Koyama, Ina (JP); Katsuhiko Miyazaki, Minowa-machi (JP); Manabu Oka, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/689,978

(22) Filed: Oct. 22, 2003

(65) Prior Publication Data

US 2004/0135474 A1 Jul. 15, 2004

(30) Foreign Application Priority Data

Oct. 23, 2002 (JP) ........................................ 2002-308765
Aug. 4, 2003 (JP) ........................................ 2003-285903

(51) Int. Cl.[7] .............................................. H01L 41/08
(52) U.S. Cl. ...................................................... 310/344
(58) Field of Search ................................ 310/344, 346, 310/348

(56) References Cited

U.S. PATENT DOCUMENTS 4,750,246 A * 6/1988 Pollard ........................ 29/25.35
5,631,609 A * 5/1997 Oka et al. ..................... 331/68
6,703,768 B2 * 3/2004 Kageyama et al. .......... 310/344
6,734,605 B2 * 5/2004 Kinoshita .................... 310/348

FOREIGN PATENT DOCUMENTS

| JP | A 63-244905 | 10/1988 |
| JP | A 4-334202 | 11/1992 |
| JP | B2 3101996 | 8/2000 |
| JP | A 2001-332932 | 11/2001 |

* cited by examiner

Primary Examiner—Mark Budd
(74) Attorney, Agent, or Firm—Oliff & Berridge, PLC

(57) ABSTRACT

The invention provides a piezoelectric oscillator having a reduced horizontal size and capable of being mounted in a small area. The invention also provides a portable telephone and an electronic device using such a piezoelectric oscillator. The piezoelectric oscillator includes a first package and a second package which are firmly connected to each other such that the second package is located on the first package. An oscillator circuit element is disposed in the first package, and a piezoelectric resonator is disposed in the second package. The first package includes a first lead frame and a second lead frame. End parts of the first lead frame are bent downward such that the bent portions at the lower end are exposed to the outside and serve as the first connection terminals. The second lead frame is placed on the first lead frame. End parts of the second lead frame are bent upward so as to serve as second connection terminals. The first connection terminals described above are used as mounting terminals. The second connection terminals are electrically connected to external terminals of the second package.

17 Claims, 14 Drawing Sheets

FIRST MODIFICATION

SECOND MODIFICATION

FOURTH MODIFICATION

PIEZOELECTRIC OSCILLATOR, PORTABLE TELEPHONE USING A PIEZOELECTRIC OSCILLATOR, AND ELECTRONIC DEVICE USING A PIEZOELECTRIC OSCILLATOR

BACKGROUND OF THE INVENTION

1. Field of Invention

The present invention relates to a piezoelectric resonator, a piezoelectric oscillator including an oscillator circuit element to oscillate the piezoelectric resonator, and a portable telephone and an electronic device using a piezoelectric oscillator.

2. Description of Related Art

A related art piezoelectric oscillator disposed in a package can be used in a wide variety of devices, for example, in small information devices, such as a HDD (hard disk drive), a mobile computer, and an IC card, and mobile communication devices, such as a portable telephone, a mobile telephone, and a paging system.

The related art constructs a piezoelectric oscillator in such a manner that a piezoelectric resonator and an oscillator are first constructed in separate packages and then the package including the piezoelectric resonator is placed on the package including the oscillator, as disclosed in Japanese Unexamined Patent Application Publication No. 63-244905.

The technique disclosed above can reduce or avoid various problems which will occur if the piezoelectric resonator and the oscillator circuit element are disposed in the same package.

That is, if the piezoelectric resonator and the oscillator circuit element are both disposed in the same resin-molded package, gas produced during the curing process is adsorbed by the piezoelectric resonator and degradation in performance occurs.

The above problem can be reduced or avoided by disposing the piezoelectric resonator and the oscillator circuit element in separate packages and putting one of them on the other. Furthermore, this technique makes it possible to produce a piezoelectric oscillator in a small form.

In the related art, it is advantageous to reduce in size various devices using a piezoelectric oscillator. To provide this advantage, it is required to further reduce the size of the piezoelectric oscillator.

To address or achieve the above requirement in the piezoelectric oscillator produced by housing a piezoelectric resonator and an oscillator circuit element in separate packages and then putting one of them on the other, the related art provides a structure shown in FIGS. 23 and 24, as disclosed in Japanese Unexamined Patent Application Publication No. 2001-332932.

FIG. 24 is a cross-sectional view taken along Plane C—C of FIG. 23. As shown in FIGS. 23 and 24, a piezoelectric oscillator includes an oscillator 2 and a piezoelectric resonator 3 firmly placed on the oscillator 2.

In the piezoelectric resonator 3, a piezoelectric resonator 7 is disposed in an internal space S1 of a ceramic package 3a. Grooves 5 are formed on side faces of the ceramic package 3a and electrodes 6 connected to the piezoelectric resonator 7 are formed in the respective grooves 5. The upper end of the ceramic package 3a is closed with a lid 4 made of metal.

The oscillator 2 is produced by placing an oscillator circuit element 11 on a device mounting part of a lead frame 13 and molding them with a resin 14. Of a plurality of leads 13a and 13b of the lead frame 13, leads 13a are bent downward such that they serve as external connection terminals used to mount the oscillator 2. The other leads 13b are bent upward and connected to the electrodes 6 formed in the grooves 5 of the piezoelectric resonator 3.

As described above, by using the lead frame 13 of the oscillator 2 in conjunction with the structure including the grooves 5 of the piezoelectric resonator 3, the electrodes 6 of the piezoelectric resonator 3 are electrically connected to the leads 13a of the oscillator 2 in a highly reliable fashion. Furthermore, this structure also allows components to be easily positioned.

SUMMARY OF THE INVENTION

In the piezoelectric oscillator 1 described above, bending is performed on parallel extending leads 13a and 13b of one lead frame 13 on which the oscillator circuit element 11 is to be mounted such that the leads 13a and 13b are bent in opposite directions. The provision of different types of leads 13a and 13b bent in opposite directions causes an increase in the horizontal size.

That is, in the piezoelectric oscillator 1, although it is intended to reduce the horizontal size to minimize the space required to mount the piezoelectric oscillator 1 by vertically placing the packages of the oscillator 2 and the piezoelectric resonator 3 such that one is located on the other thereby minimizing the number of parts arranged in the horizontal direction, the reduction in the horizontal size of the piezoelectric oscillator 1 is limited, and the piezoelectric oscillator 1 still has a rather large horizontal size.

Furthermore, it is generally difficult to bend leads 13a and 13b formed in the same lead frame 13 in different directions. Thus, this technique creates another problem: how to produce the piezoelectric oscillator 1.

The present invention provides a piezoelectric oscillator having a reduced horizontal size and capable of being mounted in a small area. The present invention also provides a portable telephone and an electronic device using a piezoelectric oscillator.

To address or achieve the above, the present invention provides a piezoelectric oscillator including a first package in which an oscillator circuit element to form an oscillator is disposed and a second package in which a piezoelectric resonator is disposed, the second package being firmly connected to the first package such that the second packaged is located on the first package, the first package including a first lead frame and a second lead frame, an end portion of the first lead frame being bent in a direction away from the second package such that the end portion is exposed to the outside and such that the exposed end portion serves as a first connection terminal, an end portion of the second lead frame being bent in a direction toward the second package such that the end portion is exposed to the outside and such that the exposed end portion serves as a second connection terminal, the first connection terminal and the second connection terminal being located such that they overlap with each other when viewed in a vertical direction, the oscillator circuit element being connected to internal terminals of respective first and second lead frames, the first connection terminal serving as a mounting terminal, the second connection terminal being electrically connected to an external terminal of the second package, the first package and the second package being firmly connected to each other.

In this piezoelectric oscillator, the first package includes at least the first lead frame and the second lead frame. The end portion of the first lead frame is bent in the direction away from the second package such that the end portion is exposed to the outside and such that the exposed end portion serves as the first connection terminal, and the end portion of the second lead frame is bent in the direction toward the second package such that the end portion is exposed to the outside and such that the exposed end portion serves as the second connection terminal. The first connection terminal used as the mounting terminal, and the first package and the second package are electrically connected to each other using the second connection terminal. That is, the method of connecting the first package to a mounting board or the like on which the piezoelectric oscillator is mounted is realized by one lead frame, and the method of electrically connecting the first package to the second package is realized by another lead frame. The first and second lead frames formed separately are disposed such that one is located on the other. In this structure, because each lead frame does not include an end part to be bent in a direction opposite to the direction in which the other end parts of that lead frame are bent, the horizontal size of the lead frame can be reduced, and thus the horizontal size of the piezoelectric oscillator can be reduced or minimized.

As a result, it is possible to provide a piezoelectric oscillator which can be mounted in a small area.

Furthermore, the first package and the second package are fixed to each other such that the external terminals of the first package are in direct contact with the corresponding second connection terminals of the second package.

The direct contact between the external terminals of the first package and the second connection terminals of the second package results in an enhancement in heat conduction between the first package and the second package. For example, when the oscillator circuit element in the first package has the temperature detection capability to perform temperature compensation on the piezoelectric resonator in the second package, the good heat conduction reduces or minimizes the thermal gradient between the two packages thereby ensuring that the piezoelectric oscillator operates precisely.

In another aspect of the present invention, a space between the first package and the second package is filled with a good thermal conductor with a higher thermal conductivity than air.

In this aspect, the thermal conductor filled in the space between the first package and the second package provides a thermal conduction path. For example, when the oscillator circuit element in the first package has the temperature detection capability to perform temperature compensation on the piezoelectric resonator in the second package, the thermal conductor reduces or minimizes the thermal gradient between the two packages thereby ensuring that the piezoelectric oscillator operates precisely.

In another aspect of the present invention, the end part of the first lead frame and the end part of the second lead frame are formed so as to be different in shape from each other thereby creating a difference in shape between the part, exposed to the outside on the surface of the package, of the first connection terminal and the part, exposed to the outside on the surface of the package, of the second connection terminal.

In this aspect, the difference in appearance allows the first connection terminal and the second connection terminal of the second package to be easily distinguished from each other. This makes it possible to prevent the second package from being dealt with in a wrong manner.

In another aspect of the present invention, a portion of the end part of the first lead frame is bent in a direction away from the second package such that the bent portion at the lower end is exposed to the outside and serves as the first connection terminal, while the remaining portion of the end part horizontally extends and serves as a control terminal.

In this aspect, because the control terminal is exposed via the cut-out part formed in the side face of the first package, it is possible to easily bring a test pin into contact with the control terminal. This allows the piezoelectric oscillator to be easily tested. The control terminal can extend in the horizontal direction within the cut-out parts without extending to the outside beyond the outer surface of the first package and thus without causing an increase in the total size.

In another aspect of the present invention, the oscillator circuit element is fixed to one of the first and second lead frames.

In this aspect, even if water intrudes into the piezoelectric oscillator from the lower side thereof, the water cannot easily reach the oscillator circuit element. Thus, the oscillator circuit element is protected from being damaged by water. Furthermore, in this structure, when a temperate compensation circuit is added to the oscillator circuit element, a temperature sensor of the temperature compensation circuit can be disposed in close proximity of the piezoelectric resonator. This makes it possible to reduce or minimize the temperature difference between the temperature sensor and the piezoelectric resonator, thereby ensuring that the temperature characteristic of the piezoelectric resonator is precisely compensated.

In another aspect of the present invention, a side end face of the mounting terminal is exposed on the outer surface of a molding resin.

In this aspect, when the piezoelectric oscillator is mounted on a mounting board or the like by soldering, an excess part of molten solder goes upward along the side face of the mounting terminal from the major surface of the mounting terminal. This makes it possible to easily check by visual inspection whether the mounting terminal is well connected to the mounting board.

In another aspect of the present invention, the side end face of the mounting terminal protrudes from the outer surface of a molding resin.

In this aspect, when the piezoelectric oscillator is mounted on a mounting board or the like by soldering, an excess part of molten solder goes upward from the major surface of the mounting terminal to the upwardly extending part of the mounting terminal molded with the resin, and a solder fillet is formed. This makes it possible to more easily check by visual inspection whether the mounting terminal is well connected to the mounting board.

In another aspect of the present invention, a molding resin is removed from a major surface of the mounting terminal of the first package molded with the resin.

In this aspect, it is ensured that the major surface of the mounting terminal is well plated with solder.

In another aspect of the present invention, the mounting terminal of the first package is formed at a location higher than the lower surface of the first package.

In this aspect, when the piezoelectric oscillator is mounted on a mounting board, a gap produced between the mounting board and the mounting terminal is filled with molten solder, and the solder remains therein after the solder is solidified. This makes it possible to easily check by visual inspection whether the mounting terminal is well connected.

In another aspect of the present invention, the mounting terminal of the first package is formed at the same height as the height at which a control terminal connected to the oscillator circuit element is formed.

In this aspect, in the processing of the lead frame, because the lead to be used as the mounting terminal and the lead to be used as the control terminal are formed at the same height, it is not needed to bend the lead corresponding to the first connection terminal, and thus the process performed on the lead frame is simplified.

In another aspect of the present invention, the outer end portion of the first connection terminal of the first lead frame used to form the first package is cut off together with other unnecessary portions of the first lead frame when resin molding is performed.

In this aspect, molding with the resin is performed while pressing the first connection terminal to be formed into the mounting terminal against the mold such that the major surface of the first connection terminal is maintained in direct contact with the inner surface of the mold. After completion of molding, the unnecessary outer part of the first connection terminal is cut off. This prevents the molding resin from remaining, in the form of flash, on the major surface of the first connection terminal serving as the mounting terminal, and thus it becomes unnecessary to remove resin flash.

To address or achieve the above, the present invention also provides a portable telephone apparatus which includes a portable telephone and a piezoelectric oscillator. The portable telephone obtains a control clock signal from the piezoelectric oscillator, the piezoelectric oscillator including a first package in which an oscillator circuit element to form an oscillator is disposed and a second package in which a piezoelectric resonator is disposed, the second package being firmly overlaid on the first package, the first package including a first lead frame and a second lead frame, an end portion of the first lead frame being bent in a direction away from the second package such that the end portion is exposed to the outside and such that the exposed end portion serves as a first connection terminal, an end portion of the second lead frame being bent in a direction toward the second package such that the end portion is exposed to the outside and such that the exposed end portion serves as a second connection terminal, the first connection terminal and the second connection terminal being located such that they overlap with each other when viewed in a vertical direction, the oscillator circuit element being connected to internal terminals of respective first and second lead frames, the first connection terminal serving as a mounting terminal, the second connection terminal being electrically connected to an external terminal of the second package, the first package and the second package being firmly connected to each other.

To address or achieve the above, the present invention also provides an electronic apparatus which includes an electronic device and a piezoelectric oscillator. The electronic device obtains a control clock signal from a piezoelectric oscillator, the piezoelectric oscillator including a first package in which an oscillator circuit element to form an oscillator is disposed and a second package in which a piezoelectric resonator is disposed the second package being firmly overlaid on the first package, the first package including a first lead frame and a second lead frame, an end portion of the first lead frame being bent in a direction away from the second package such that the end portion is exposed to the outside and such that the exposed end portion serves as a first connection terminal, an end portion of the second lead frame being bent in a direction toward the second package such that the end portion is exposed to the outside and such that the exposed end portion serves as a second connection terminal, the first connection terminal and the second connection terminal being located such that they overlap with each other when viewed in a vertical direction, the oscillator circuit element being connected to internal terminals of respective first and second lead frames, the first connection terminal serving as a mounting terminal, the second connection terminal being electrically connected to an external terminal of the second package, the first package and the second package being firmly connected to each other.

BRIEF DESCRIPTION OF THE DRAWINGS

FIG. 20A is a plan view of the piezoelectric oscillator, in which a first package is cross-sectioned, FIG. 20B is a plan view of the piezoelectric oscillator, and FIG. 20C is a bottom view of the piezoelectric oscillator;

FIG. 21A shows a step of placing solder balls, and FIG. 21B shows a state in which the solder balls are melted;

DETAILED DESCRIPTION OF PREFERRED EMBODIMENTS

Figure 1:
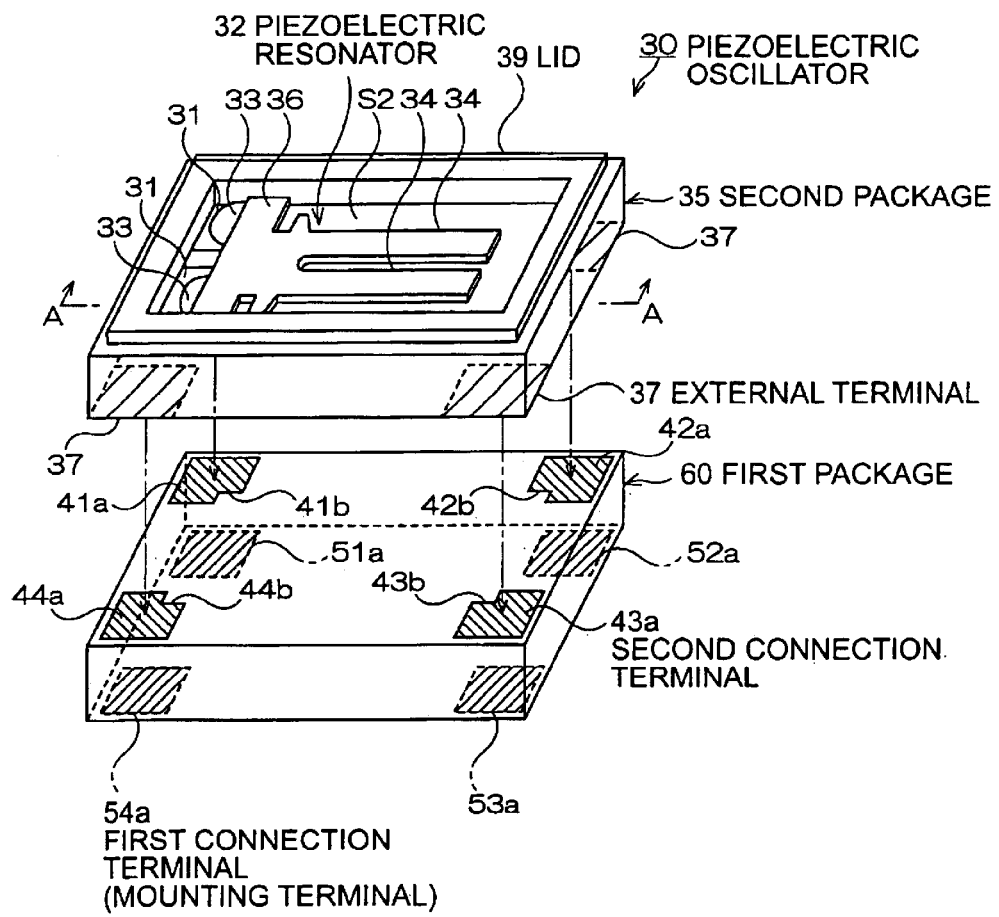
FIG. 1 is an exploded perspective view schematically showing a piezoelectric oscillator according to an exemplary embodiment of the present invention.
Figure 2:
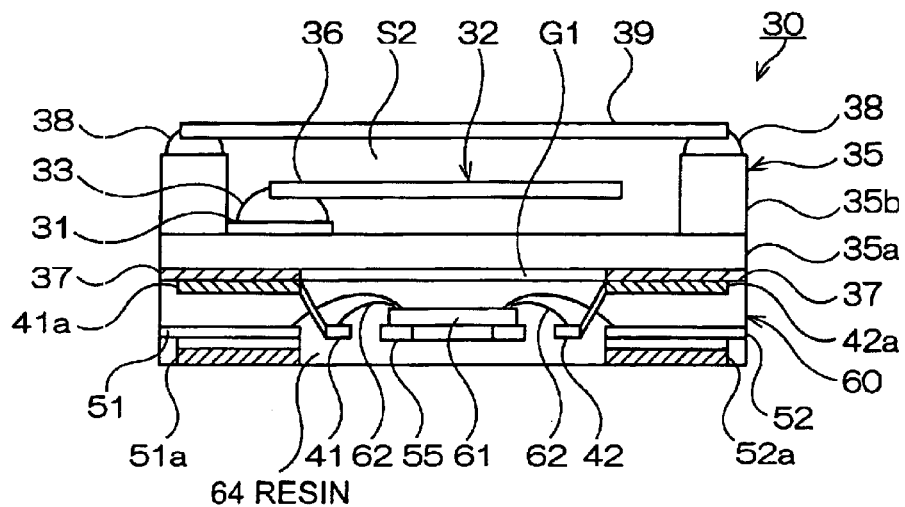
FIG. 2 is a cross-sectional view of the piezoelectric oscillator, taken along Plane A—A of FIG. 1.

FIGS. 1 and 2 show a piezoelectric oscillator according to a first exemplary embodiment of the present invention, where FIG. 1 is an exploded perspective view schematically showing the piezoelectric oscillator, and FIG. 2 is a cross-sectional view taken along Plane A—A of FIG. 1.

As shown in these figures, a piezoelectric oscillator 30 includes a first package 60 and a second package 35 fixed to each other such that the second package 35 is located on the first package 60. An oscillator circuit element, which is described below, is disposed in the first package 60, and a piezoelectric resonator 32 is disposed in the second package 35.

The structure of the second package 35 is described below.

As shown in FIG. 2, the second package 35 is formed by first putting a substrate a 35a, in the form of a ceramic green sheet made of an aluminum oxide-based insulating material, on a substrate 35b made of a similar material and then baking them, where an opening is formed in advance in the substrate 35b such that the opening forms an internal space S2 when the substrates 35b is disposed on the substrate 35a thereby forming a rectangular box whose upper end is open.

The internal space S2 is used to dispose the piezoelectric resonator 32.

That is, in the second package 35 according to the present exemplary embodiment, as shown in FIG. 1, electrodes 31 exposed in the internal space S2 are formed on the left-hand side of the surface of the substrate 35b by forming lower-layer electrodes by metalizing tungsten and then plating the lower-layer with nickel and further gold.

The electrodes 31 are connected to external electrodes 37 formed in four corners on the lower surface of the second package 35. Although some external packages are not shown in FIG. 1, the external electrodes are actually formed in the respective four corners on the lower surface of the second package 35. The electrodes 31 are not necessarily needed to be connected to all external terminals. The electrodes 31 are electrically connected to the first package 60, which is described in detail below, so that a driving voltage is supplied to the piezoelectric resonator 32 via the electrodes 31. The upper part of each electrode 31 is coated with a conductive adhesive 33, and a base part 36 of the piezoelectric resonator 32 is put on the conductive adhesives 33. After putting the base part 36 in the above-described manner, the conductive adhesives 33 are cured thereby bonding the base part 36 of the piezoelectric resonator 32 to the electrodes 31.

As for the electrically conductive adhesives 33, an adhesive produced by incorporating electrically conductive particles such as silver particles into a synthetic resin, such as a silicone resin, epoxy resin, or a polyimide resin, serving as an adhesive component.

The piezoelectric resonator 32 is formed of, for example, quartz. Alternatively, the piezoelectric resonator 32 may be formed of another piezoelectric material such as lithium tantalate or lithium niobate. In the present exemplary embodiment, in order to achieve a small size and necessary performance, the piezoelectric resonator 32 is formed so as to have a shape shown in FIG. 1.

More specifically, the piezoelectric resonator 32 includes a base part 36 and a pair of vibrating arms 34 extending in parallel from the base part 36. The piezoelectric resonator 32 has, as a whole, a shape similar to a tuning fork, and the base part 36 of the piezoelectric resonator 32 is firmly connected to the second package 35 as described below.

The piezoelectric resonator 32 is not limited to the tuning-fork piezoelectric resonator described above, but another type of piezoelectric resonator such as a AT-cut resonator produced by cutting a piezoelectric material into a rectangular form may also be used.

As shown in FIG. 2, the upper opening of the second package 35 is sealed with a glass lid 39 by connecting the glass lid 39 to the second package 35 with a brazing material 38, such as low-melting glass.

If the brazing material 38 and the lid 39 made of a Fe—Ni—Co alloy or the like are employed, and if the lid 39 is grounded, the lid 39 provides a shielding effect. The lid 39 can be grounded by electrically connecting the lid 39 to at least one of the external terminal 37 and further connecting to a ground electrode on the first package 60.

The first package 60 is described below.

The first package 60 is in the form of a resin package made by putting an oscillator circuit element on a lead frame, which is described below, and then molding the oscillator circuit element together with the lead frame with a resin. In the cross-sectional view of the first package 60 shown in FIG. 2, areas shaded with diagonal lines indicate various terminals. Actually, any of these terminals has a cross-section in the cross-sectional plane of FIG. 2, but the shaded areas are shown in FIG. 2 in order to indicate the vertical positions of the respective terminals.

Figure 3:
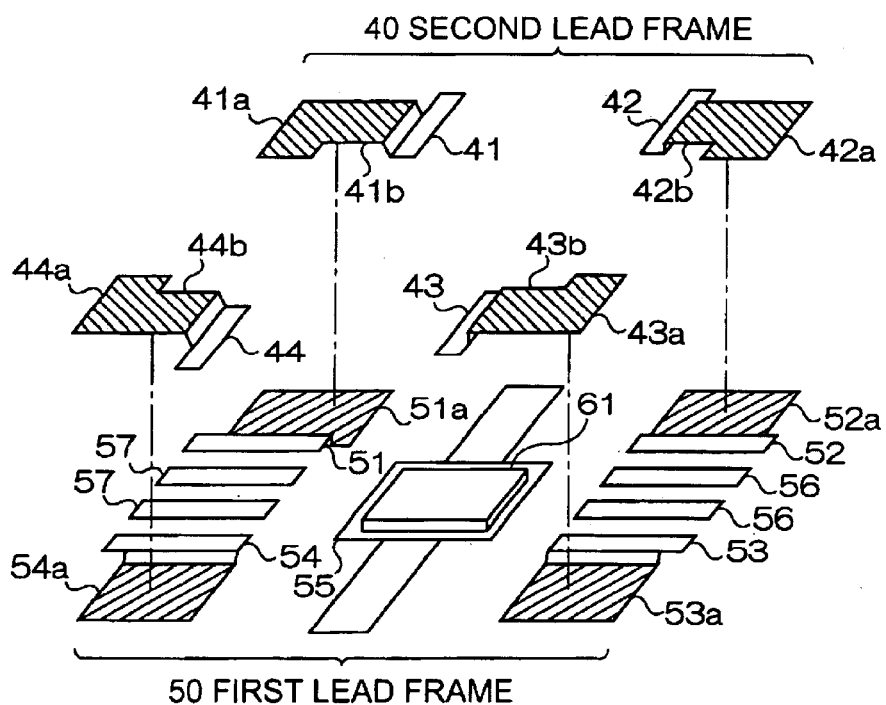
FIG. 3 is a perspective view schematically showing bent structures of a first lead frame and a second lead frame used in a first package of the piezoelectric oscillator shown in FIG. 1.
Figure 4:
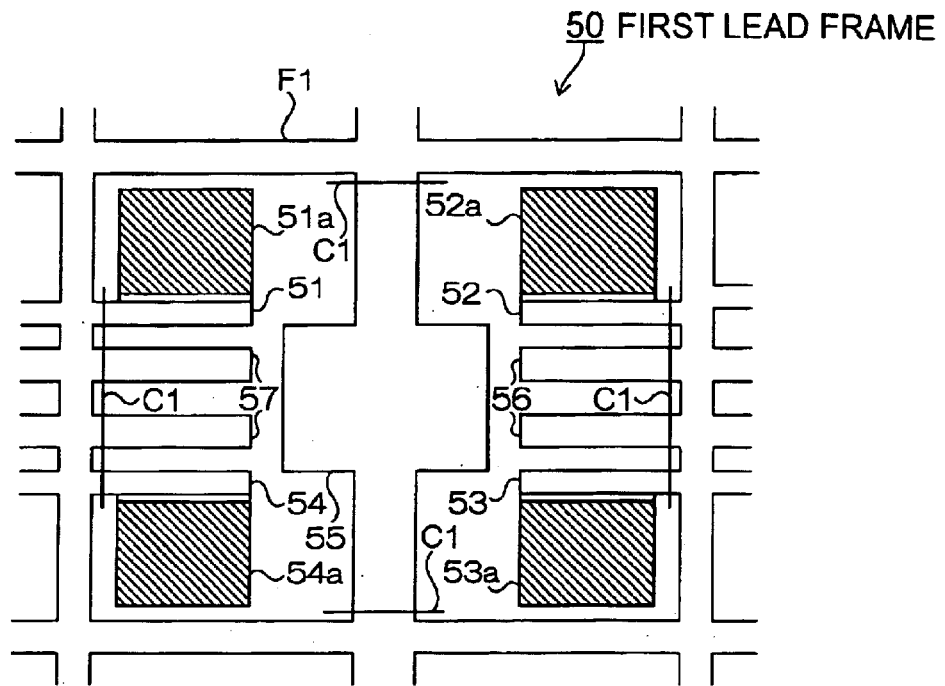
FIG. 4 is a plan view schematically showing an example of the first lead frame used in the first package of the piezoelectric oscillator shown in FIG. 1.
Figure 5:
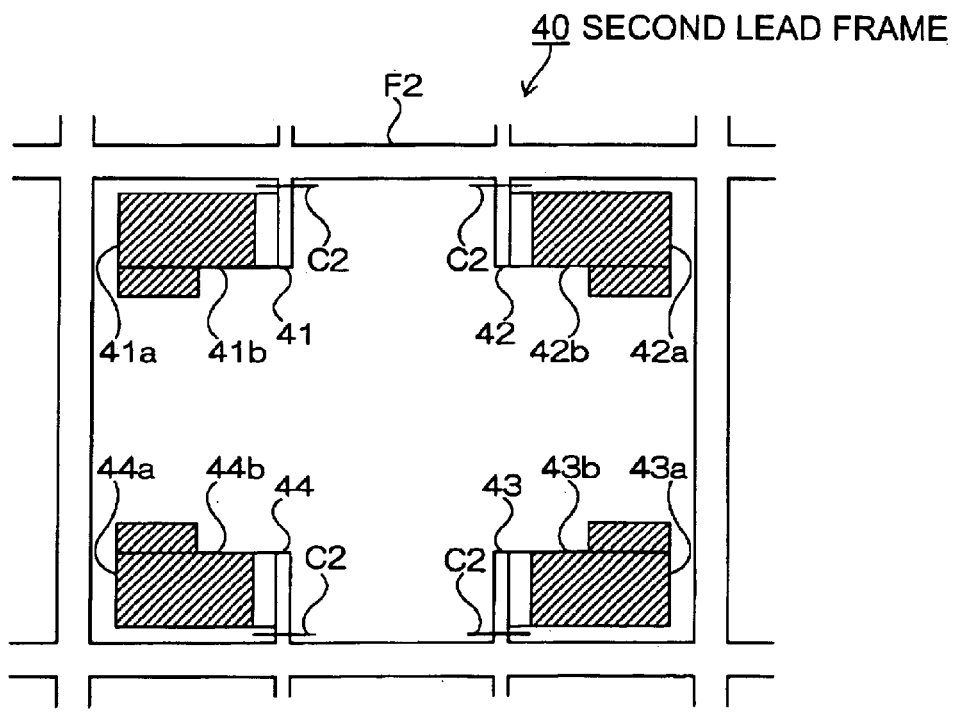
FIG. 5 is a plan view schematically showing an example of the second lead frame used in the first package of the piezoelectric oscillator shown in FIG. 1.

The structure of the lead frame used to form the oscillator circuit element and terminals of the first package 60 is described. FIG. 3 is a perspective view schematically showing the structures, in the vertical direction, of the first lead frame 50 and the second lead frame 40. FIGS. 4 and 5 are plan views of the first lead frame 50 and the second lead frame 40, respectively. In the present exemplary embodiment, two lead frames, that is, the first lead frame 50 and the second lead frame 40, are used. The first lead frame 50 and the second lead frame 40 are each made of a widely used material, for example, a Fe alloy (such as 42 alloy), a Cu alloy (such as Cu—Sn, Cu—Fe, Cu—Zn, or Cu—Ni) or a ternary alloy obtained by adding a third element to one of the alloys described above.

The first lead frame 50 shown in FIG. 4 is located at a lower position in the first package 60 as shown in FIG. 3.

FIG. 4 shows the first lead frame 50 including leads bent to a predetermined shape and connected to a rectangular-shaped frame part F1. After completion of the molding process, leads are cut along cutting lines C1.

The first lead frame 50 includes a first lead 51, a second lead 52, a third lead 53, and a fourth lead 54, which all have a similar and small rectangular shape and which are located near respective four corners. At the substantially central position, there is provided a substantially rectangular device mounting part 55 connected to the frame part F1.

In this first lead frame 50, the first lead 51, the second lead 52, the third lead 53, and the fourth lead 54 have end parts (represented by diagonal hatching) 51a, 52a, 53a, and 54a, respectively, each having a rather large area and being bent downward in FIG. 3 (in a direction away from the second package 35, in FIG. 2). Each of the end parts 51a, 52a, 53a, and 54a horizontally extends at a height lower than the remaining part of each lead. Elongated parts, other than the parts 51a, 52a, 53a, and 54a, of the first lead 51, the second lead 52, the third lead 53, and the fourth lead 54, respectively, serve as internal terminals to be connected to the oscillator circuit element which is described below.

The first lead frame 50 also includes control terminal leads 57 and 56 each having an elongated rectangular shape and extending parallel to each other, where the control terminal leads 57 are located between the first lead 51 and the fourth lead 54, and the control terminal leads 56 are located between the second lead 52 and the third lead 53.

The second lead frame 40 shown in FIG. 5 is disposed at an upper position in the first package 60, as shown in FIG. 3.

FIG. 5 shows the second lead frame 40 including leads bent to a predetermined shape and connected to a rectangular-shaped frame part F2. After completion of the molding process, leads are cut along cutting lines C2.

The second lead frame 40 includes the first lead 41, the second lead 42, the third lead 43, and the fourth lead 44, which all have a similar and small rectangular shape and which are located near respective four corners.

In this second lead frame 40, the first lead 41, the second lead 42, the third lead 43, the fourth lead 44, respectively, have end parts (represented by diagonal hatching) 41a, 42a, 43a, and 44a, respectively, each having a rather large area and being bent upward in FIG. 3 (in a direction toward the second package 35, in FIG. 2). Those end parts 41a, 42a, 43a, and 44a horizontally extend at a height higher than the remaining part of each lead. Elongated parts, other than the parts 41a, 42a, 43a, and 44a, of the first lead 41, the second lead 42, the third lead 43, and the fourth lead 44, respectively, serve as internal terminals to be connected to the oscillator circuit element which is described below.

The end parts 41a, 42a, 43a, and 44a are not necessarily needed to have a perfect rectangular shape, but they may have a different desirable shape. For example, in the present exemplary embodiment, each of the end parts 41a, 42a, 43a, and 44a has a small cut-out part 41b, 42b, 43b, or 44b formed in a corner.

As shown in FIG. 3, the oscillator circuit element 61 is mounted on the device mounting part 55 of the first lead frame 50 where the oscillator circuit element 61 is fixed to the device mounting part 55 by means of die bonding. One or more electronic components, such as an integrated circuit or a capacitor, are used as the oscillator circuit element 61.

The oscillator circuit element 61 includes at least a circuit to excite the piezoelectric resonator 32. Preferably, the oscillator circuit element 61 further includes a thermosensor (not shown) serving as temperature detection means which allows the piezoelectric resonator 32 to operate as a temperature-compensated resonator.

In FIG. 3, the oscillator circuit element 61 firmly mounted on the device mounting part 55 is electrically connected to the first lead 41, the second lead 42, and the third lead 43 each serving as an internal terminal of the second lead frame 40 via bonding metal wires such as Au wires, as shown in FIG. 2.

The oscillator circuit element 61 is also electrically connected to the first lead 51, the second lead 52, the third lead 53, and the fourth lead 54 each serving as an internal terminal of the first lead frame 50 via bonding metal wires, such as Au wires as shown in FIG. 2. Furthermore, the oscillator circuit element 61 is also electrically connected to inner end part of each of the control terminal leads 57 and 56 of the first lead frame 50 via bonding metal wires, such as Au wires (not shown).

After the oscillator circuit element 61 is fixed to the first and second lead frames 50 and 40 in the state shown in FIGS. 4 and 5 and wires are wire-bonded between the oscillator circuit element 61 and the respective leads as shown in FIG. 2, the first package 60 is molded with an insulating synthetic resin such as an epoxy resin 64 by injection molding. The molding is performed such that the upwardly-bent parts 41a, 42a, 43a, and 44a of the second lead frame 40 are exposed to the outside via the upper surface of the resin package and such that the downwardly-bent parts 51a, 52a, 53a, and 54a of the first lead frame 50 are exposed to the outside via the lower surface (bottom surface) of the resin package. Thereafter, the frames F1 and F2 of the respective first and second lead frames 50 and 40 in the states shown in FIGS. 4 and 5 are removed by cutting the leads along cutting lines C1 and C2. Thus, a complete first package 60, such as that shown in FIGS. 1 and 2, is obtained.

In the first package 60 formed in the above-described manner, as shown in FIG. 1, the parts 41a, 42a, 43a, and 44a of the first to fourth leads 41, 42, 43, and 44, respectively of the second lead frame 40 are exposed to the outside in the respective four corners on the upper surface of the first package 60 such that those exposed parts serve as second connection terminals.

On the other hand, the parts 51a, 52a, 53a, and 54a of the first to fourth leads 51, 52, 53, and 54, respectively of the first lead frame 50 are exposed to the outside in the respective four corners on the lower surface (bottom surface) of the first package 60 such that those exposed parts serve as first connection terminals. Those first connection terminals are used as mounting terminals when the piezoelectric oscillator 30 is mounted on a mounting board or the like.

As shown in FIG. 1, the second connection terminals 41a, 42a, 43a, and 44a on the upper surface of the first package 60 directly face external terminals 37 formed in the four corners on the lower surface of the second package 35 placed on the first package 60.

If a conductive adhesive is applied to the second connection terminals 41a, 42a, 43a, and 44a on the upper surface of the first package 60, and if the second package 35 is put thereon, the first and second packages 60 and 35 are bonded to each other such that the second connection terminals 41a, 42a, 43a, and 44a of the first package 60 are electrically connected to the respective external terminals 37 of the second package 35. The conductive adhesive (not shown) used herein may be similar to the conductive adhesive 33 used to bond the piezoelectric resonator 32 to the second package 35.

In the present exemplary embodiment constructed in the above-described manner, a method of connecting the first package 60 to a mounting board (not shown) to mount the piezoelectric oscillator 30 and also a method of electrically connecting the first package 60 to the second package 35 are formed using two separate lead frames, that is, the first lead frame 50 and the second lead frame 40, as shown in FIG. 2.

Figure 23:
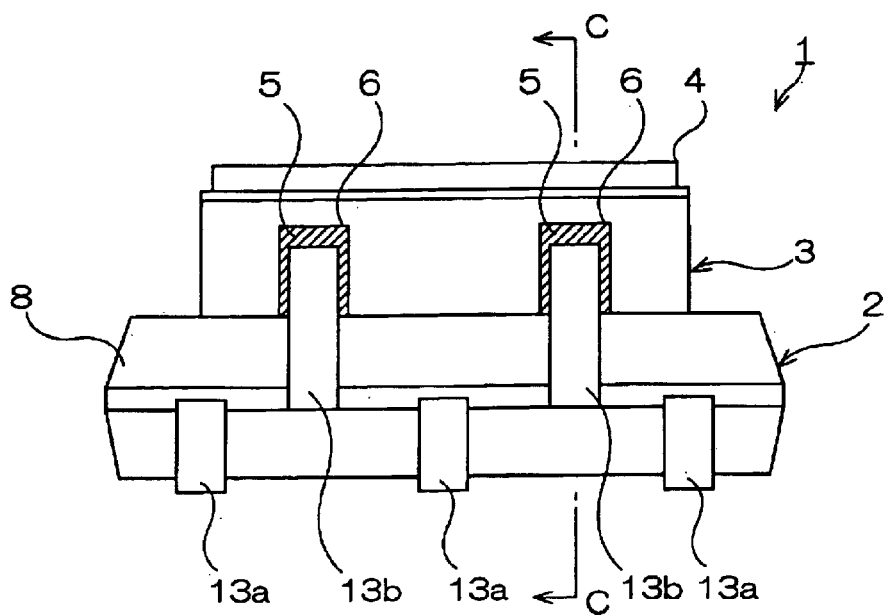
FIG. 23 is a front view schematically showing an example of a related art piezoelectric oscillator.
Figure 24:
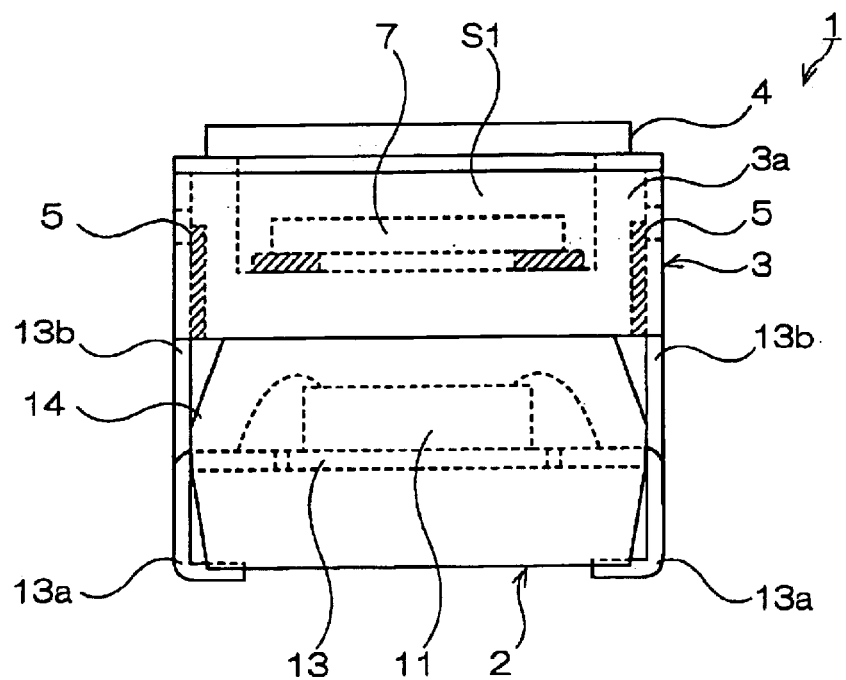
FIG. 24 is a cross-sectional view taken along Plane C—C of FIG. 23.

More specifically, the mounting terminals (first connection terminals) 51a, 52a, 53a, and 54a serving as the method of connecting the first package 60 to the mounting board (not shown) to mount the piezoelectric oscillator 30 and the second connection terminals 41a, 42a, 43a, and 44a serving as the method of electrically connecting the first package 60 to the second package 35 are formed such that the locations of the second connection terminals 41a, 42a, 43a, and 44a overlap with the corresponding mounting terminals when viewed in the vertical direction, as shown in FIGS. 1 and 2. In this structure, unlike the structure shown in FIG. 23, each lead frame does not include an end part to be bent in a direction opposite to the direction in which the other end parts of that lead frame are bent, and thus the horizontal size of the lead frame can be reduced. As a result, the horizontal size of the piezoelectric oscillator 30 can be reduced or minimized.

Thus, the present exemplary embodiment of the invention can provide a piezoelectric oscillator which needs a small area in which it is mounted.

In the piezoelectric oscillator 30, the oscillator circuit element 61 is molded with a resin so as to seal the oscillator circuit element 61 within the first package 60, and the piezoelectric resonator 32 is disposed within the second package 35 made of ceramic prepared separately from the first package 60. In this structure, unlike the structure in which both the piezoelectric resonator 32 and the oscillator circuit element 61 are disposed in the same resin package, the piezoelectric resonator is not exposed to gas produced when the resin is cured, and thus it is ensured that no degradation in performance occurs. Furthermore, the piezoelectric oscillator 30 can be produced by separately producing first packages 60 and second packages 35, selecting a good first package 60 and a good second package 35, and combining the selected first package 60 and the second package 35. In this technique, unlike the technique in which both the piezoelectric resonator 32 and the oscillator circuit element 61 are disposed in the same common resin package, the resultant complete piezoelectric oscillator 30 does not have any failure caused by some bad component. This makes it possible to efficiently use components.

In the first package 60, as shown in FIGS. 1 and 2, the second connection terminals 41a, 42a, 43a, and 44a exposed to the outside via the upper surface have cut-out parts 41b, 42b, 43b, and 44b, respectively, formed in a corner. That is, the shapes of the second connection terminals 41a, 42a, 43a, and 44a are different from the rectangular shapes of the mounting terminals 51a, 52a, 53a, and 54a on the lower surface (bottom surface) of the first package 60.

This allows the first connection terminals serving as mounting terminals 51a, 52a, 53a, and 54a to be easily distinguished in appearance from the second connection terminals 41a, 42a, 43a, and 44a, and thus, in production, it is possible to prevent the first package 60 from being incorrectly dealt with, for example, in a manner in which the first package 60 is placed upside down on the second package 35.

In the present piezoelectric oscillator 30, as shown in FIG. 3, the oscillator circuit element 61 is firmly mounted on one of the first lead frame 50 and the second lead frame 40. In this specific exemplary embodiment, the oscillator circuit element 61 is firmly mounted on the device mounting part 55 of the first lead frame 50. In this structure, even if water intrudes into the piezoelectric oscillator 30 from the lower side thereof, the water cannot easily reach the oscillator circuit element 61. Thus, the oscillator circuit element 61 is protected from being damaged by water. Furthermore, in this structure, when a temperate compensation circuit is added to the oscillator circuit element 61, a temperature sensor of the temperature compensation circuit can be disposed in close proximity of the piezoelectric resonator. This makes it possible to reduce or minimize the temperature difference between the temperature sensor and the piezoelectric resonator, thereby ensuring that the temperature characteristic of the piezoelectric resonator is precisely compensated.

Referring to FIGS. 6 to 12, exemplary modifications of the first package 60 according to the exemplary embodiment are described below. A piezoelectric oscillator can be formed by fixing a second package 35 similar to that described above onto a first package 60 according to one of the exemplary modifications. In this piezoelectric oscillator, the second package 35 has no structural difference from that described above, and thus only the first package according to the exemplary modifications is described below. In these exemplary modifications, similar parts to those shown in FIGS. 1 and 5 are denoted by similar reference numerals. Thus, a duplicated description thereof is not given herein, and only different parts are described below.

Figure 6:
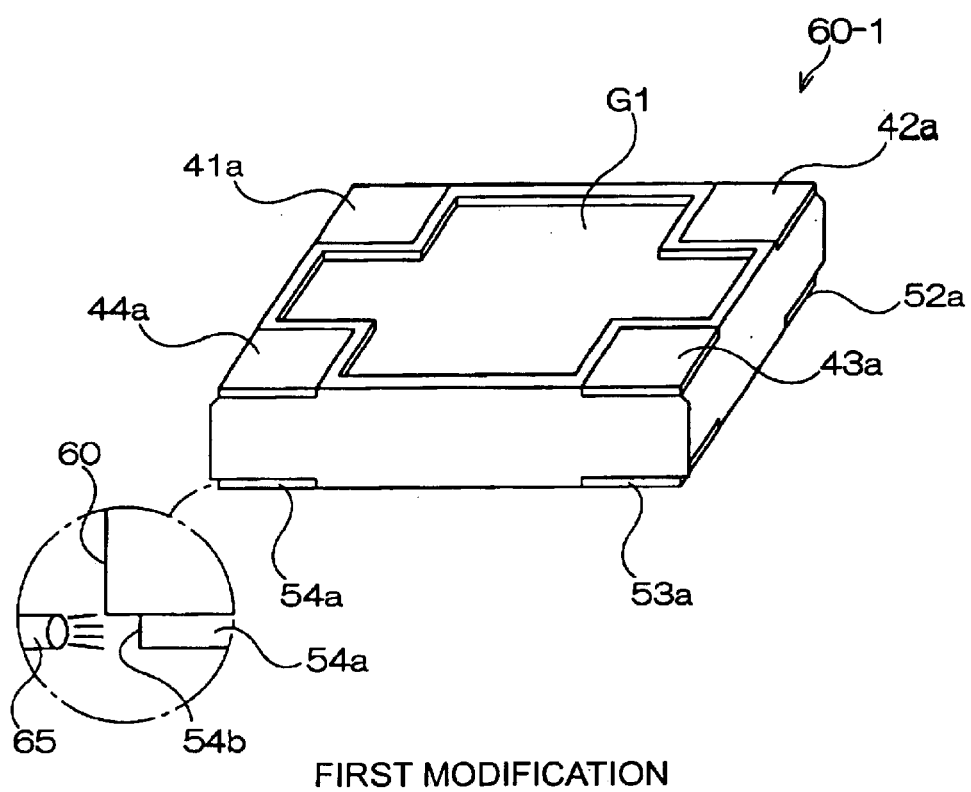
FIG. 6 is a perspective view schematically showing a first exemplary modification of the first package of the piezoelectric oscillator shown in FIG. 1.
Figure 7:
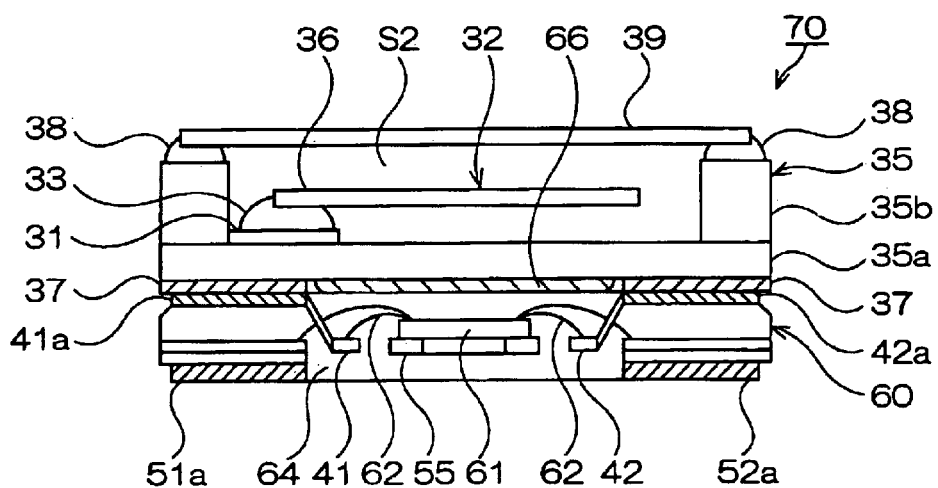
FIG. 7 is a cross-sectional view schematically showing a piezoelectric oscillator formed using the first package shown in FIG. 6.

FIG. 6 shows a first exemplary modification of the first package 60. FIG. 7 is a cross-sectional view, corresponding to FIG. 2, of a piezoelectric oscillator 70 obtained by combining the first package 60-1 according to the first exemplary modification and the second package 35.

The second connection terminals 41a, 42a, 43a, and 44a of the second package 35 and the mounting terminals 51a, 52a, 53a, and 54a of the first package 60 are processed as shown at the lower left of FIG. 6. Note that although the insertion at the lower left of FIG. 6 shows the manner in which only one mounting terminal 54a is processed, the other mounting terminals and the second connection terminals are also processed in a similar manner.

That is, as shown in FIG. 6, a liquid containing small abrasive particles is effused from a nozzle 65 against an outer side face 54b of the mounting terminal 54a thereby horning the mounting terminal 54a such that the resin is removed from the outer side face where the mounting terminal 54a is formed thereby ensuring that the mounting terminal 54a is exposed. As a result, a recess is formed after the resin is partially removed. When the piezoelectric oscillator 70 is mounted on a mounting board or the like by means of soldering, solder gets into the recess and a hem of solder is formed there. This results in an increase in the soldering strength, which ensures that the mounting terminals are electrically connected in a highly reliable fashion.

Figure 13:
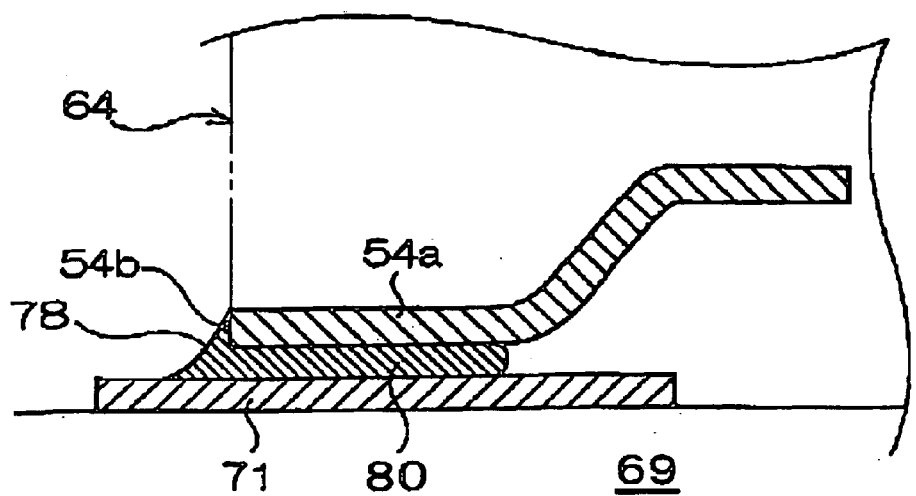
FIG. 13 is a partially enlarged schematic showing a mounting structure of the piezoelectric oscillator shown in FIG. 1.

On the other hand, in the case in which no recess is formed and the end face 54b of the mounting terminal 54a is simply exposed on the outer surface of the molding resin 64, when the piezoelectric oscillator 30 is mounted on the mounting board 69 using solder 80, an excess part of solder gets upward along the side face of the mounting terminal 54a from the major surface of the mounting terminal 54a and a solder fillet 78 is formed, as shown in FIG. 13. This makes it possible to easily check by visual inspection whether the mounting terminal 54a is well connected to the mounting board 69.

Furthermore, as shown in FIG. 6, a recessed space G1 formed on the first package 60 is filled with a good thermal conductor such as a silicone resin having higher thermal conductivity than air, as shown in FIG. 7.

As a result, the first package 60 and the second package 35 are connected to each other via the good thermal conductor 66 serving as a thermal conduction path, and thus further good thermal conduction is achieved between the first package 60 and the second package 35. In this structure, when the oscillator circuit element 61 in the first package 60 has the temperature detection capability to perform temperature compensation on the piezoelectric resonator 32 disposed in the second package 35, the thermal conductor 66 minimizes the thermal gradient between the two packages thereby ensuring that the piezoelectric oscillator 70 operates precisely.

Figure 8:
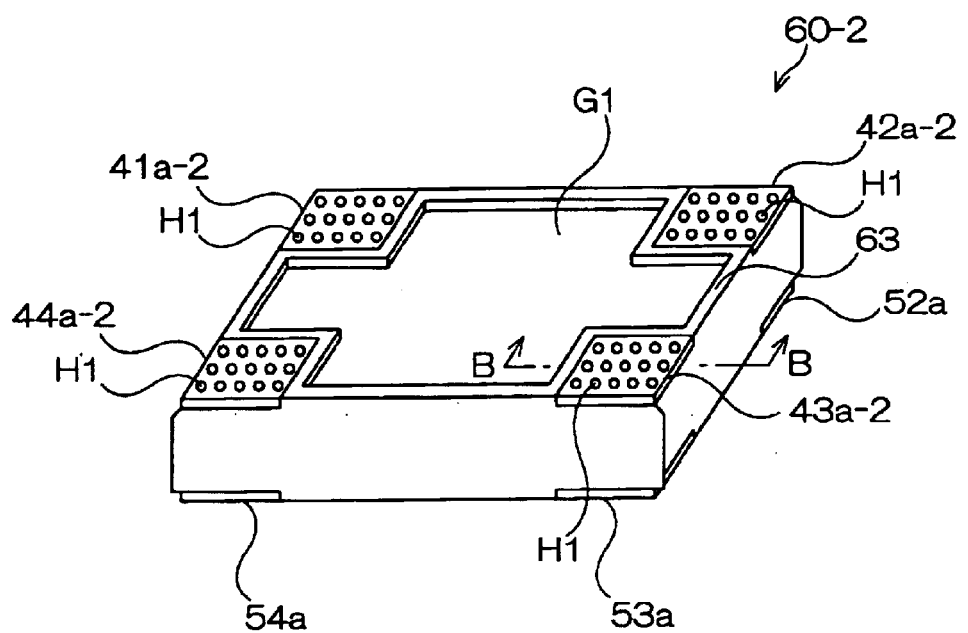
FIG. 8 is a perspective view schematically showing a second exemplary modification of the first package of the piezoelectric oscillator shown in FIG. 1.
Figure 9:
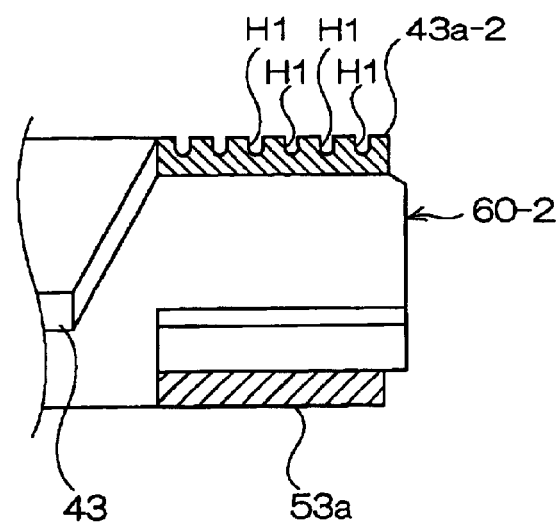
FIG. 9 is a cross-sectional view taken along Plane B—B of FIG. 8.

FIG. 8 shows a second exemplary modification of the first package 60, and FIG. 9 is a cross-sectional view taken along Plane B—B of FIG. 8. In this first package 60-2 according to the second exemplary modification, the surface of each of the second connection terminals 41a-2, 42a-2, 43a-2, 44a-2 are dimpled. That is, a plurality of or a large number of small holes or recesses H1 are formed in the surface.

In this structure, when the second connection terminals 41a-2, 42a-2, 43a-2, and 44a-2 and the corresponding external terminals 37 are bonded using an electrically conductive adhesive thereby connecting the first package 60-2 and the second package 35 to each other, the electrically conductive adhesive gets into the small holes or recesses H1, and those portions of the electrically conductive adhesive in the small holes or recesses H1 serve as anchors which ensure strong bonding.

Similar small holes or recesses H1 may also be formed in the mounting terminals 51a, 52a, 53a, and 54a of the first package 60-2 thereby achieving a further increase in connection strength of the piezoelectric oscillator.

Figure 10:
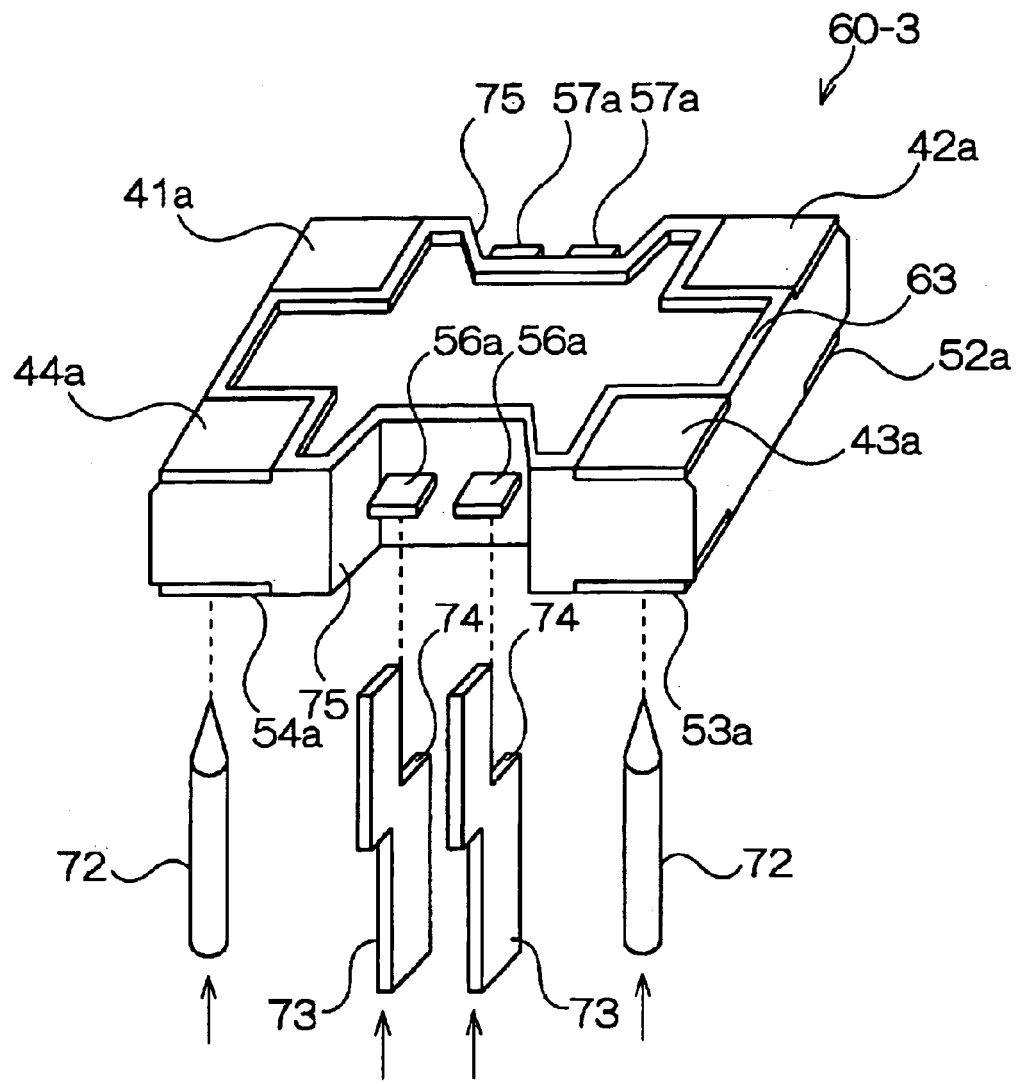
FIG. 10 is a perspective view schematically showing a third exemplary modification of the first package of the piezoelectric oscillator shown in FIG. 1.
Figure 11:
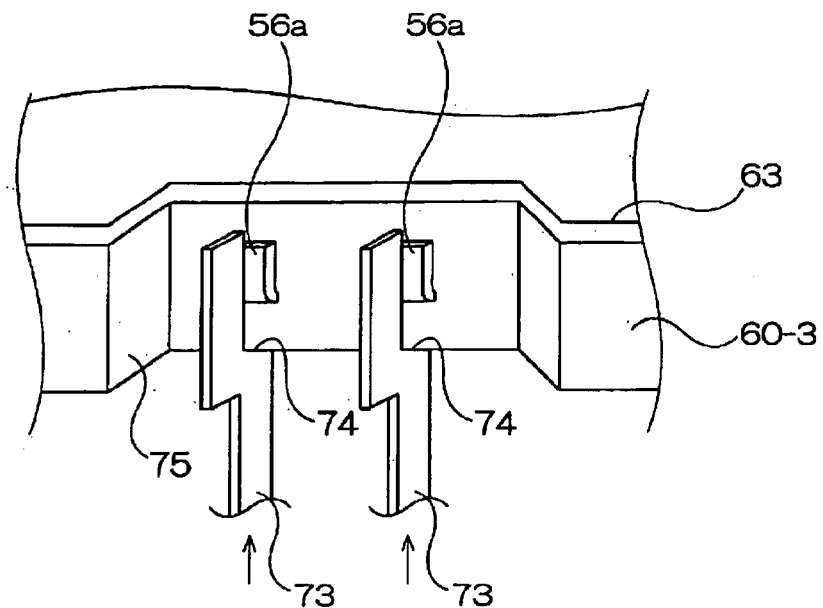
FIG. 11 is a partially enlarged perspective view showing a manner in which control terminals of the first package shown in FIG. 10 are bent.

FIG. 10 shows a third exemplary modification of the first package 60, and FIG. 11 is a partially enlarged view of FIG. 10, showing a manner in which testing is performed on a piezoelectric oscillator using a first package 60-3 according to the third exemplary modification.

As shown in FIG. 10, cut-out parts 75 each having an inwardly recessed shape are formed at a substantially central location of respective side faces, represented as being on the front and rear sides in FIG. 10, of the first package 60-3. In each of the cut-out parts 75, a pair of control terminals 57a or 56a extrudes horizontally and parallel from each side face of the first package 60-3. As described above with reference to FIGS. 3 and 4, the control terminals 57a and 56a are end parts integrally formed with the first lead frame 50 and connected to the oscillator circuit element 61 so that they serve as input/output terminals of the oscillator circuit element 61.

As shown in FIG. 10, power supply terminal pins 72 can be brought into contact with respective mounting terminals 54a and 53a from below of the first package 60-3 in a direction represented by arrows. On the other hand, test terminal pins 73 each having a substantially L-shape and having an upward step part 74 formed at the end are moved in a direction represented by arrows so that the upward step parts 74 of the test terminal pins 73 are brought into contact with the respective control terminals 56a. Although not shown in FIG. 10, similar test terminal pins are brought into contact with the control terminals 57a on the rear side of the first package 60-3.

Thus, in the third exemplary modification in which the control terminals 56a are exposed in the cut-out parts 75 on the side faces of the first package, testing can be easily performed simply by bringing the test terminal pins 73 into contact with the respective control terminals 56a as shown in FIG. 10. Furthermore, in this structure, the control terminals 56a exposed in the cut-out parts 75 can extend in the horizontal direction within the cut-out parts 75 without extending to the outside beyond the outer surface of the first package 60-3 and thus without causing an increase in the total size.

After completion of testing, if the test terminal pins 73 are further moved upward while maintaining the upward step parts 74 in contact with the respective control terminals 56a, the control terminals 56a are bent upward as shown in FIG. 11. In this state, if the test terminal pints 73 are removed, the control terminals 56a are maintained in the bent state. Thus, after the completion of testing, the first package 60-3 is in the state in which the control terminals 56a do not extend horizontally from the side faces but are bent upward in the cut-out parts 75. This is convenient in treating, because the control terminals 56a are moved apart from the mounting plane.

The testing described above may be performed either before or after the first package 60-3 is combined with the second package 35 into the complete form of the piezoelectric oscillator 70.

Figure 12:
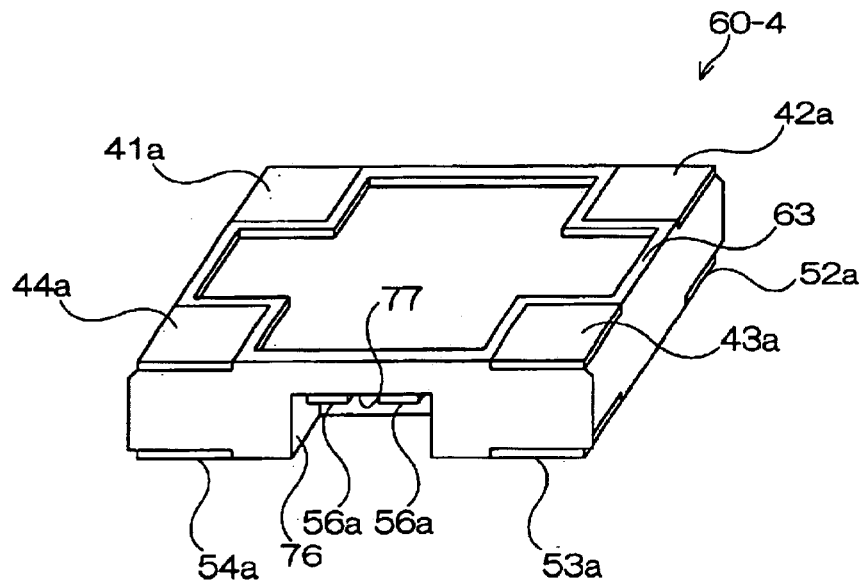
FIG. 12 is a perspective view schematically showing a fourth exemplary modification of the first package of the piezoelectric oscillator shown in FIG. 1.

FIG. 12 shows a fourth exemplary modification of the first package 60. The first package 60-4 according to the fourth exemplary modification is similar to the first package 60-3 according to the third exemplary modification except that there is a difference in shape of the cut-out parts.

That is, as shown in FIG. 12, a downward step part 77 is formed at the upper side of each cut-out part 76 such that each control terminal 56a exposed in the cut-out part 76 is supported by the downward step part 77.

In this structure, when testing is performed by bringing the test terminal pins 73 into contact with the control terminals 56a in the manner described above with reference to FIG. 10, the control terminals 56a urged upward by the test terminal pints 73 are supported by the downward step parts 77, and thus the control terminal pins 56a are prevented from being bent. Because the control terminals 56a are not deformed during the testing, it is possible to perform the testing repeatedly as required.

Figure 14:
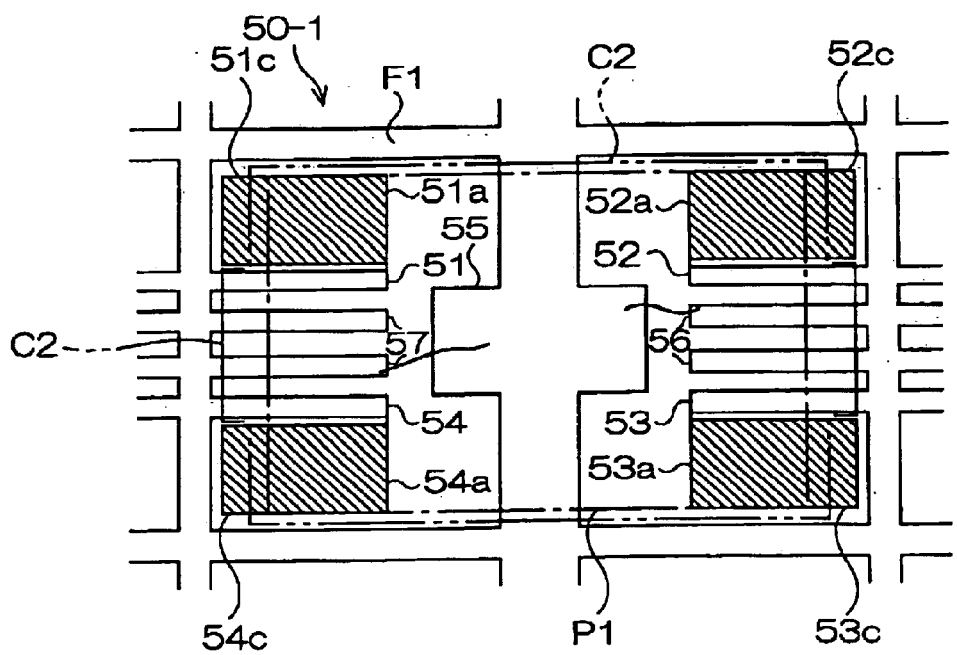
FIG. 14 is a plan view schematically showing a cutting line along which a lead frame is cut to produce the first package of the piezoelectric oscillator shown in FIG. 1.

FIG. 14 shows an example of a desirable manner in which a lead frame is cut after completion of the resin molding process. The lead frame shown herein in FIG. 14 corresponds to the first lead frame 50 shown in FIG. 4. In this example, the first lead frame 50-1 is formed such that each of parts 51a, 52a, 53a, and 54a of leads has a shape which is longer in the horizontal direction than in the vertical direction as shown in FIG. 14. In order that the parts 51a, 52, 53a, and 54a can be used as mounting terminals of the piezoelectric oscillator, those parts are formed, unlike the structure shown in FIG. 4, such that they extend to the outside in the horizontal direction.

In FIG. 14, a single dotted line P1 represents an area to be molded with a resin, and double dotted line C2 represents a cutting line along which the lead frame is to be cut. In this structure, unlike the structure shown in FIG. 4, extruding parts 51c, 52c; 53c, and 54c extending to the outside from the resin are formed at location where mounting terminals are to be formed.

Figure 15:
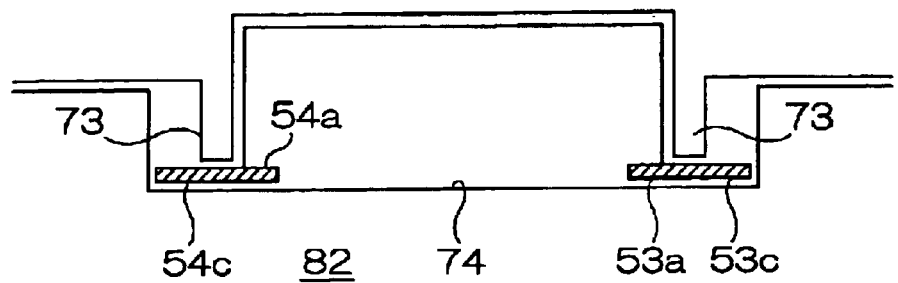
FIG. 15 is a schematic showing a manner in which the lead frame 14 is molded with resin to produce a resin-molded package.

FIG. 15 is a schematic showing a manner in which the first package used to house a IC is produced by molding using the above-described structure.

In FIG. 15, a molten resin is put into a cavity, which is created between an upper mold 81 and a lower mold 82 when they are mated with each other, thereby forming a molding resin 64. A presser part 73 extruding downward in FIG. 15 is formed along the periphery of the upper mold 81 so that when the upper mold 81 and the lower mold 82 are mated together, the presser part 73 is brought into contact with the extruding parts 53c and 54c of the leads 53a and 54a which will form the mounting terminals, thereby pressing the extruding parts 53c and 54c against the lower mold 82. As a result, the major surface of each of the leads 53a and 54a, that is, the lower surface thereof, is brought into intimate contact with the upper surface 74 of the lower mold 82. This reduces or prevents the resin from adhering to the lower surfaces of the mounting terminals, and thus it becomes unnecessary to perform a troublesome process to remove mold flash after completion of the molding process.

In the case in which the molding method described above is not employed, the resin adhering to the lower surface of the leads 53a and 54a is removed. The absence of resin on the lower surface of the leads 53a and 54a ensures that the lower surface of each of the leads 53a and 54a can be well plated to form the mounting terminals.

Figure 16:
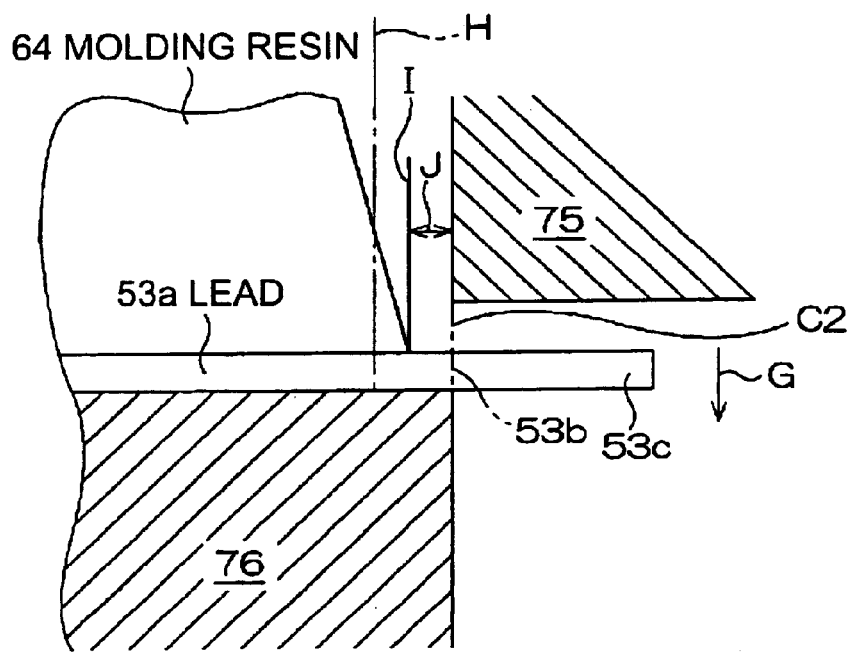
FIG. 16 is a partially enlarged schematic showing a manner in which an unnecessary part of the lead frame is cut off after the completion of the molding process shown in FIG. 15.

FIG. 16 is a schematic showing a manner in which an unnecessary part of the lead frame is cut off after the completion of the molding process.

In the cutting-off process performed after completion of the molding process, the unnecessary part is removed from the frame part F1 shown in FIG. 15 by performing cutting along a cutting line C2 shown in FIG. 16. As shown in FIG. 16, the parts 51a, 52a, 53a, and 54a of the leads, to be formed into the mounting terminals, have the extruding parts 51c, 52c, 53c, and 54c, respectively, which extend to the outside slightly from the side faces of the molding resin.

More specifically, after completion of the molding process, as shown in FIG. 16, the first lead frame is put on a lower blade 76 of a cutting machine as shown in FIG. 16, and the extruding part 53c is cut by moving an upper blade 75 in a downward direction G as represented by an arrow so that an end face 53b is created after the extruding part 53c is cut.

In the cutting process described above, positioning is performed such that after the extruding part 53c of the lead 53a is cut, a part of the extruding part 53c with a predetermined length of J remains in the outside of the molding resin 64. In this cutting method, even if a positioning error occurs, and if, as a result of the positioning error, the extruding part 53c is cut along a dashed line H, the end surface 53b is exposed to the outside from the resin 64. This ensures that a solder fillet is formed in the mounting process as described above with reference to FIG. 13, thereby making it possible to easily check whether a good connection is achieved.

Figure 17:
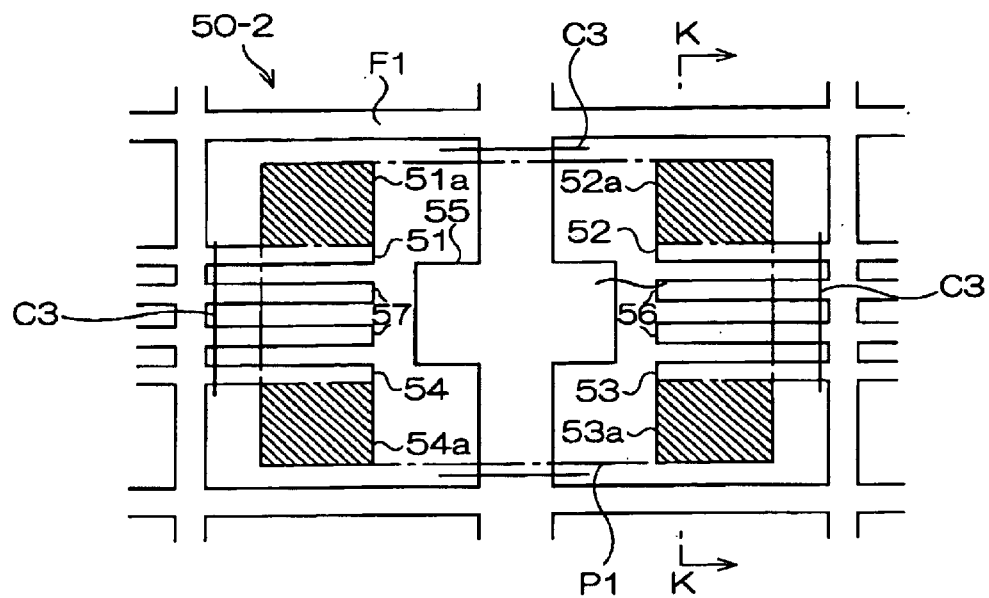
FIG. 17 is a plan view showing another structure of a lead frame (first lead frame) used to form the first package of the piezoelectric oscillator shown in FIG. 1.
Figure 18:
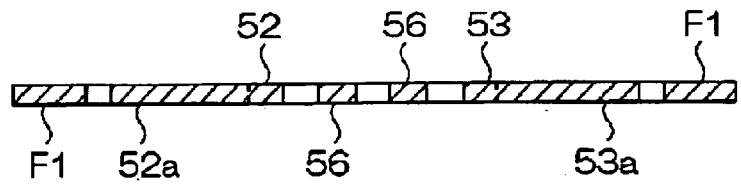
FIG. 18 is a cross-sectional view taken along Plane K—K of FIG. 17.

FIG. 17 is a plan view showing a first lead frame 50-2 constructed into another structure. FIG. 18 is a cross-sectional view taken along Plane K—K of FIG. 17.

In this example, the parts 51a, 52a, 53a, and 54a of leads to be formed into mounting terminals lie in the same plane as that in which the leads 56 and 57 to be formed into control terminals lie. In this structure, the bending process described earlier with reference to FIG. 2 is not necessary, and thus the production process can be simplified.

Figure 19:
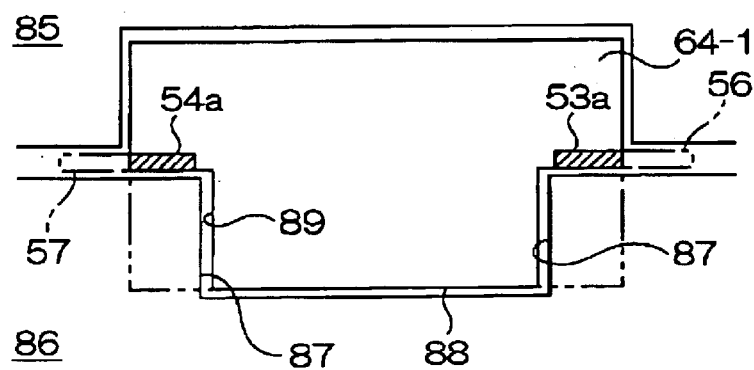
FIG. 19 is a schematic showing a manner in which the lead frame shown in FIG. 17 is molded with resin to form a resin-molded package.

FIG. 19 is a schematic showing a manner in which a resin-molded package is formed using the first lead frame 50-2.

In FIG. 19, a molten resin is injected into a cavity which is created between an upper mold 85 and a lower mold 86 when they are mated with each other. In this process, the parts 54a and 53a of leads to be formed into the mounting terminals at the same height as that of the leads 56 and 57 to be formed into the control terminals are clamped between the upper mold 85 and the lower mold 86.

The lower mold 86 has extrusions 87 in areas corresponding to the parts 54a and 53a of leads. Those extrusions 87 cause the molding resin 64-1 to have recesses 89 in which the parts 54a and 53a of leads to be formed into the mounting terminals are exposed.

Figure 20A:
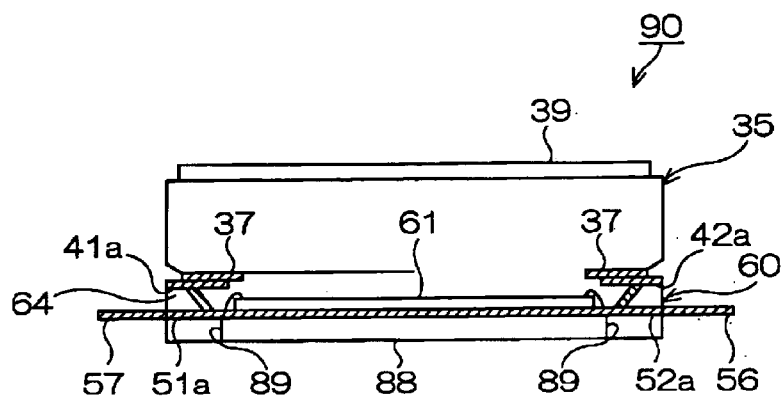
FIGS. 20A, 20B, and 20C are schematics showing a piezoelectric oscillator via the molding process shown in FIG. 19, where
Figure 20B:
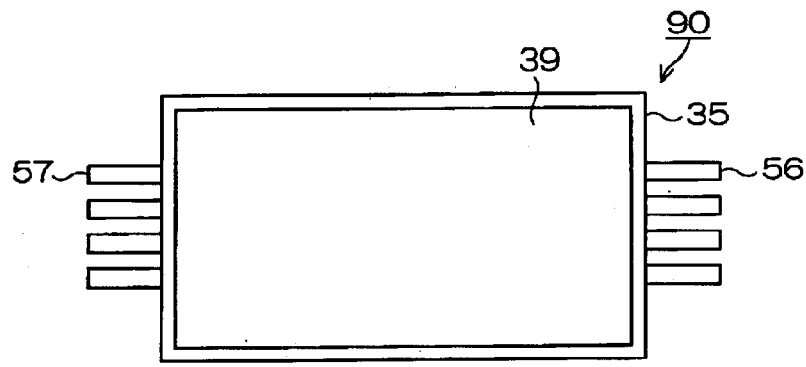
Figure 20C:
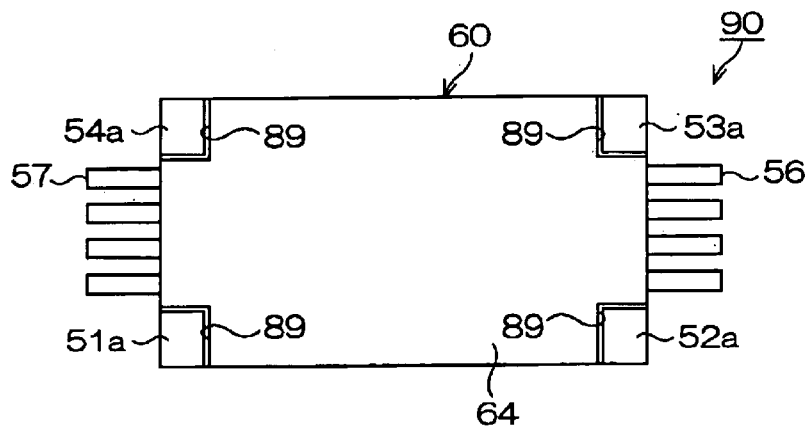

FIGS. 20A to 20C are diagrams showing a piezoelectric oscillator 90 including a first package 60 produced using the technique described above, where FIG. 20A is a diagram of the piezoelectric oscillator 90, in which the first package 60 is cross-sectioned, FIG. 20B is a plan view of the piezoelectric oscillator 90, and FIG. 20C is a bottom view of the piezoelectric oscillator 90.

As shown in those figures, recesses 89 are formed in the lower surface of the first package 60 of the piezoelectric oscillator 90, and the parts 51a, 52a, 53a, and 54a of the leads to be formed into the mounting terminals are exposed in the recesses 89. In this structure, the lower surface 88 of the first package is located at a height lower than the major surface (lower surface) of the mounting terminal. Therefore, when the piezoelectric oscillator 90 is mounted, the leads 56 and 57 forming the control terminals are maintained apart from the mounting board. This reduces or prevents the control terminals of the mounted piezoelectric oscillator 90 from being in contact with an interconnection pattern, which would create a short circuit. The height of the recesses 89 is set to a value, for example, 1 mm, which is sufficient to achieve the above purpose.

Figure 21A:
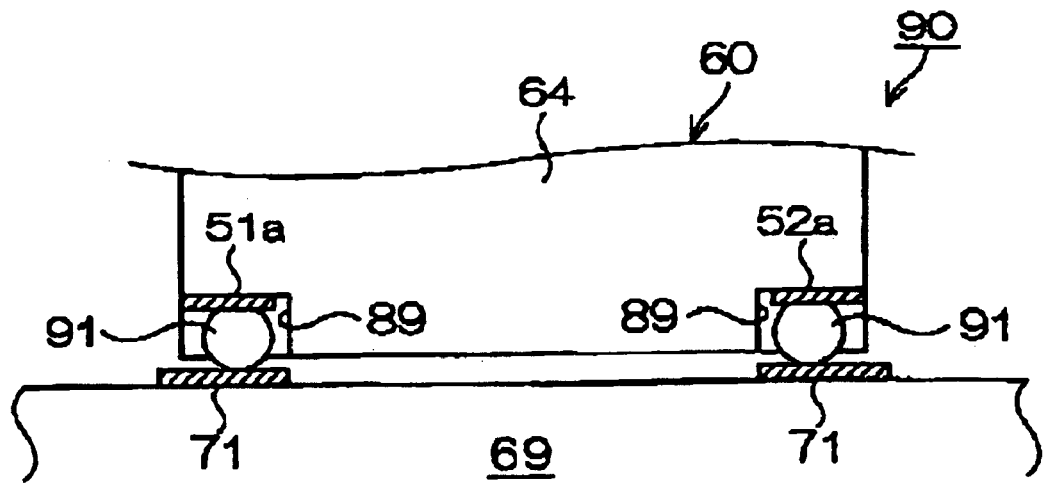
FIGS. 21A and 21B are partially enlarged views showing a process of mounting the piezoelectric oscillator shown in FIGS. 20A–20C, where
Figure 21B:
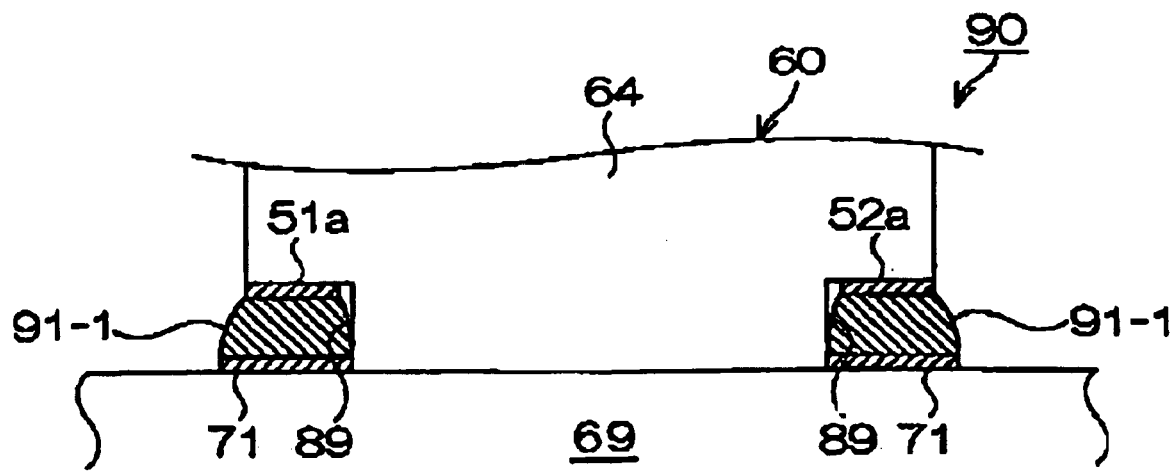

FIGS. 21A and 21B show a manner in which the piezoelectric oscillator 90 is mounted. In those figures, of various parts of the piezoelectric oscillator 90, only the first package 60 is shown.

As shown in FIG. 21A, solder balls 91 are formed on electrodes 71 of a mounting board 69. Thereafter, the solder balls are melted as denoted by reference numeral 91-1 in FIG. 21B thereby connecting the piezoelectric oscillator 90 to the mounting board 69.

As described above, in the mounting process, the recesses 89 formed in the first package 60 allow the solder balls 91 to be precisely positioned.

Figure 22:
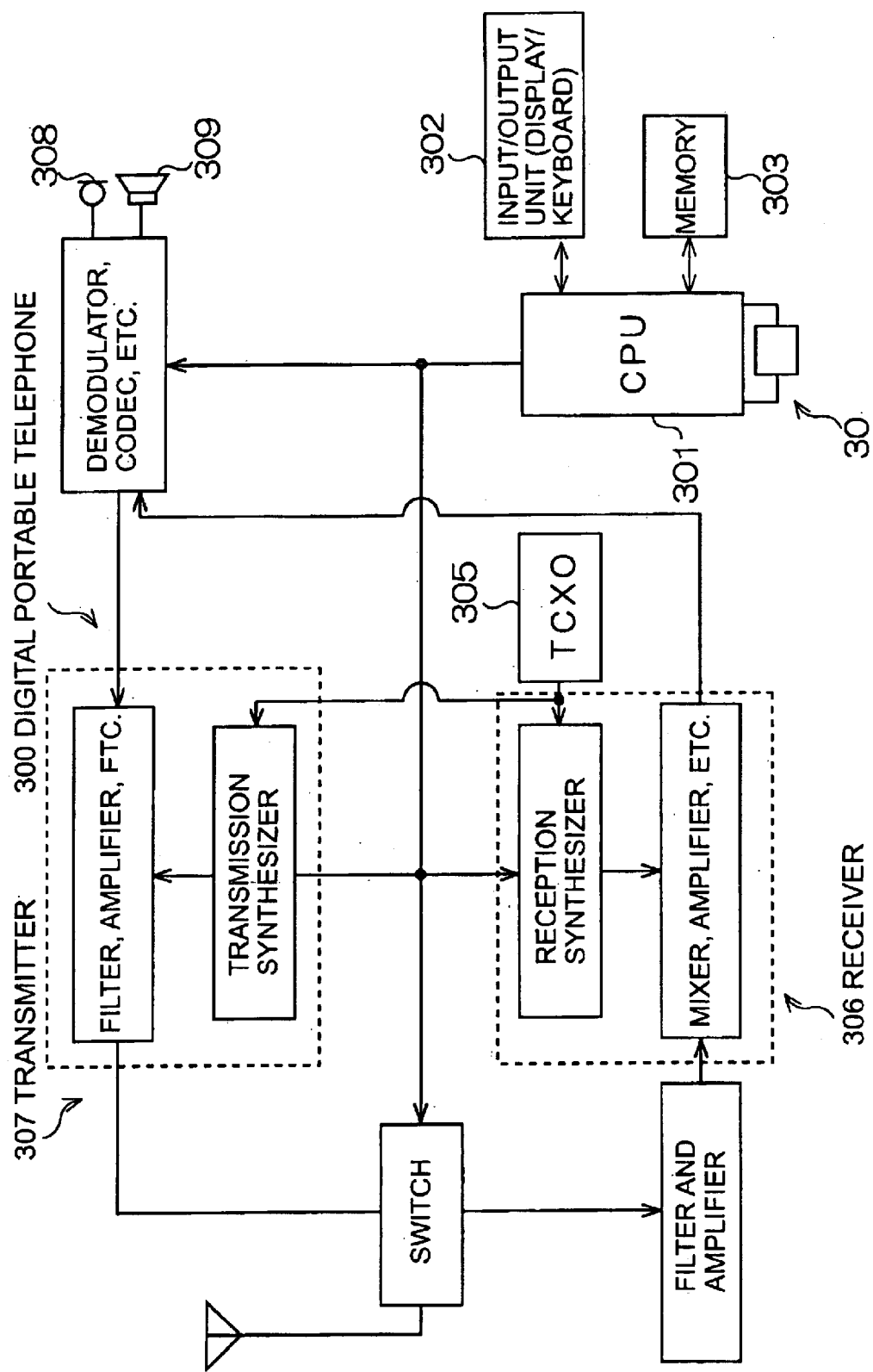
FIG. 22 is a schematic showing a digital portable telephone, which is an example of an electronic device using a piezoelectric oscillator according to an exemplary embodiment of the present invention.

FIG. 22 is a schematic showing a digital portable telephone, which is an example of an electronic device using a piezoelectric oscillator according to one of the above-described exemplary embodiments of the present invention.

In FIG. 22, a microphone 308 converts a voice of a user into an electric signal. The electric signal is digitally modulated by a demodulator/codec. The resultant signal is frequency-converted to a frequency in a RF (Radio Frequency) band by a transmitter 307 and transmitted via an antenna to a base station (not shown). On the other hand, a RF signal transmitted from a base station is frequency-converted by a receiver 306 and further converted into a voice signal by the demodulator/codec. A voice is output from a speaker 309 in accordance with the voice signal. A CPU (Central Processing Unit) 301 controls the entire operation of the digital portable telephone 300 including an input/output unit 302 including a liquid crystal display and a keyboard 302. A memory 303 is information storage means such as a ROM and a RAM controlled by the CPU 301. A program for controlling the digital portable telephone and information, such as a telephone number list, are stored in the memory 303.

A TCXO (Temperature Compensated X'stal Oscillator) 305 is a piezoelectric oscillator according to one of the exemplary embodiments of the present invention. The TCXO 305 has a capability of compensating for a frequency variation due to a change in ambient temperature and is used as a frequency generator for generating a reference frequency used by the receiver 306 and the transmitter 307 shown in FIG. 22. The TCXO 305 is a component widely used in portable telephones. As the size of the portable telephone is reduced, there is an increasing need for a further reduction in the size of the TCXO 305. The TCXO according to one of the exemplary embodiments of the present invention is very useful to meet the above requirement.

By employing, in an electronic device, such as the digital portable telephone 300, a piezoelectric oscillator according to one of the exemplary embodiments of the present invention, such as the piezoelectric oscillator 30 or the piezoelectric oscillator 70 or 90, which can be mounted in a mounting space with small horizontal dimensions, it is possible to reduce the total size of the digital portable telephone 300. Furthermore, the good thermal conductivity disposed between the first package in which the piezoelectric resonator is disposed and the second package in which the temperature sensor and the temperature compensation circuit are disposed allows the achievement of excellent temperature compensation characteristic.

The present invention is not limited to the specific exemplary embodiments described above. The techniques employed in the exemplary embodiments and exemplary modifications may be combined together or may be combined with another technique which is not described herein. Some of the techniques employed in the exemplary embodiments or exemplary modifications may not be used.

In the exemplary embodiments described above, the first package is produced using two lead frames. Alternatively, the first package may be produced using three or more lead frames. The number and the shape of terminals formed from the lead frames are not limited to those employed in the specific exemplary embodiments described above, but an arbitrary number and an arbitrary shape may be employed.

What is claimed is:

1. A polishing tool for polishing silicon wafers, said tool comprising an endless belt which includes a continuous unseamed textile fabric supporting a polishing layer, said polishing layer comprising a microcellular or microporous urethane, wherein said fabric is woven and comprises aramid yarns oriented in the lengthwise direction and said polishing layer includes two layers which are of different hardness.

2. A polishing tool according to claim 1 wherein an exposed surface of said polishing layer is formed with grooves.

3. A polishing tool according to claim 1 wherein an upper of said two layers includes beads of plastic, glass or a soluble material.

4. A polishing tool according to claim 1 wherein said polishing layers comprises hollow beads of plastic, glass or other soluble material.

5. An endless belt for polishing semiconductor wafers comprising a continuous unseamed textile fabric supporting a polishing layer, said polishing layer comprising a microcellular or microporous urethane, wherein said fabric is woven and includes aramid yarns oriented in the lengthwise direction, and said polishing layer comprises two layer which are of different hardness.

6. An endless belt according to claim 5 wherein an exposed surface of said polishing layer is formed with grooves.

7. An endless belt according to claim 5 wherein an upper of said two layers includes beads of plastic, glass or a soluble material.

8. An endless belt according to claim 5 wherein said polishing layers comprises hollow beads of plastic, glass or other soluble material.

9. An endless belt for polishing optical flats comprising a continuous unseamed textile fabric supporting a polishing layer, said polishing layer comprising a microcellular or microporous urethane, wherein said fabric is woven and comprises aramid yarns oriented in the lengthwise direction and said polishing layer includes two layers which are of different harness.

10. An endless belt according to claim 9 wherein an exposed surface of said polishing layer is formed with grooves.

11. An endless belt according to claim 9 wherein an upper of said two layers includes beads of plastic, glass or a soluble material.

12. An endless belt according to claim 9 wherein said polishing layers comprises hollow beads of plastic, glass or other soluble material.

13. An endless belt for polishing mirrors comprising a continuous unseamed textile fabric supporting a polishing layer, said polishing layer comprising a microcellular or microporous urethane, said polishing layer including two layers which are of different hardness.

14. An endless belt according to claim 13 wherein said fabric is woven and comprises aramid yarns oriented in the lengthwise direction.

15. An endless belt according to claim 13 wherein an exposed surface of said polishing layer is formed with grooves.

16. An endless belt according to claim 13 wherein an upper of said two layers includes beads of plastic, glass or a soluble material.

17. An endless belt according to claim 13 wherein said polishing layers comprises hollow beads of plastic, glass or other soluble material.

* * * * *